US012656375B2

(12) United States Patent
Bilz

(10) Patent No.: US 12,656,375 B2
(45) Date of Patent: Jun. 16, 2026

(54) METHOD FOR DETERMINING THE POSITION OF THE CORES OF A TWISTED PAIR CABLE

(71) Applicant: Wieland Electric GmbH, Bamberg (DE)

(72) Inventor: Falko Bilz, Falkensee (DE)

(73) Assignee: Wieland Electric GmbH, Bamberg (DE)

( * ) Notice: Subject to any disclaimer, the term of this patent is extended or adjusted under 35 U.S.C. 154(b) by 93 days.

(21) Appl. No.: 18/544,294

(22) Filed: Dec. 18, 2023

(65) Prior Publication Data

US 2024/0201227 A1     Jun. 20, 2024

(30) Foreign Application Priority Data

Dec. 16, 2022   (DE) .................................. 102022133

(51) Int. Cl.
*G01R 15/18*     (2006.01)
*G01R 15/20*     (2006.01)
*H01B 11/02*     (2006.01)

(52) U.S. Cl.
CPC ............. *G01R 15/18* (2013.01); *G01R 15/20* (2013.01); *H01B 11/02* (2013.01)

(58) Field of Classification Search
None
See application file for complete search history.

(56) References Cited

U.S. PATENT DOCUMENTS

2008/0282565 A1* 11/2008 Livingston ............. G01B 7/312
                                                            33/550
2010/0156431 A1*  6/2010 Fried ...................... G01R 31/59
                                                            324/513

FOREIGN PATENT DOCUMENTS

DE          736897 A      1/1943
DE         1082420 B      5/1960
EP         1014099 A2     6/2000
EP        270263581 B1    5/2014
GB         2292223 A      2/1996

OTHER PUBLICATIONS

European Search Report No. EP23217287 dated Apr. 23, 2024, 9 pages.
Office Action received from the German Patent Office re Application No. 102022133744.8 dated Dec. 15, 2023, 8 pages.

* cited by examiner

*Primary Examiner* — Jas A Sanghera
(74) *Attorney, Agent, or Firm* — Michael T. Abramson; Jordan IP Law, LLC

(57)     ABSTRACT
A method for determining the position of the cores of a twisted-pair cable is intended to allow twisted-pair cables to be connected using the piercing technique. For this purpose, at a plurality of points in a scanning region which is axially and/or azimuthally extended with respect to an axis of the twisted-pair cable, an inductive coupling between a first circuit arranged at each respective point and the twisted-pair cable as a second circuit is determined, and a position of the cores of the twisted-pair cable is determined on the basis of the values determined for the inductive coupling at the points.

14 Claims, 3 Drawing Sheets

METHOD FOR DETERMINING THE POSITION OF THE CORES OF A TWISTED PAIR CABLE

RELATED CASES

Figures 1, 2, 3, 4:
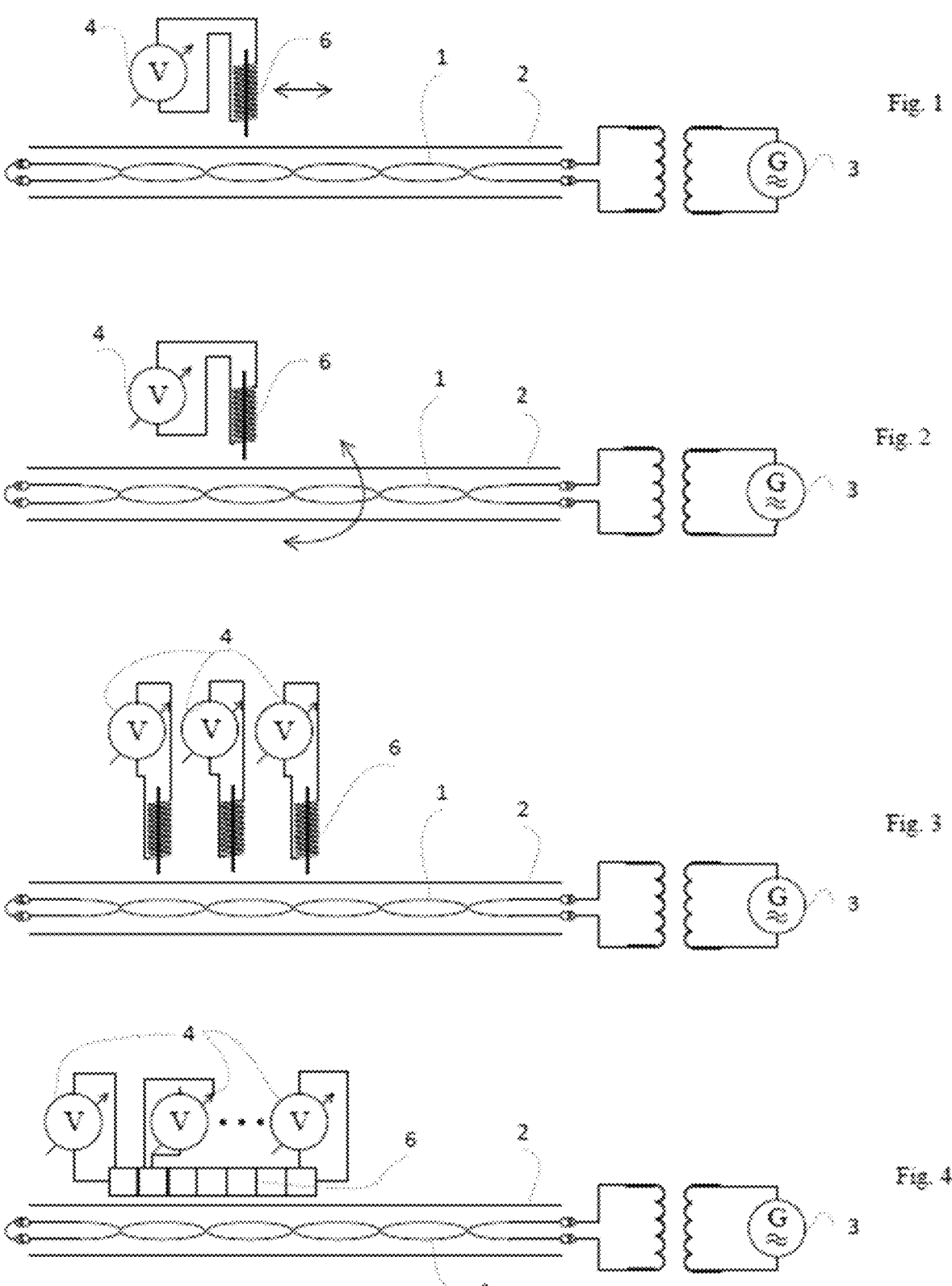

This application claims priority under 35 U.S.C. § 119 to German patent application DE 10 2022 133 744.8, filed 16 Dec. 2022, the contents of which are all incorporated by reference.

The invention relates to a method for determining the position of the cores of a twisted-pair cable. It also relates to a device for determining the position of the cores of a twisted-pair cable and to a system comprising such a device and a device for piercing a twisted-pair cable.

Twisted pair are cables used in telecommunications, communications and computer technology to describe cable types in which the wires are twisted together in pairs. Wire pairs can be twisted in a cable with different lay lengths and different directions of rotation in order to minimize crosstalk between the wire pairs. Twisted wire pairs offer better protection against electrical and magnetic interference fields than parallel wires. By twisting the wire pairs, interferences from external fields largely cancel each other out. Cables with twisted wire pairs are used for all types of signal transmission, including in network technology, e.g. as Ethernet cables or for structured cabling or in fieldbus technology.

However, the disadvantage of twisted pair cables is that the connection of such cables usually requires stripping and separating both cores. This requires increased manual effort during installation. Techniques that do not require the wires to be stripped, such as piercing technology, in which piercing mandrels are provided that drill through the conductors of the cable during assembly, would require precise knowledge of the twisting position.

It is therefore the object of the invention to specify a method of the type mentioned above, which allows twisted pair cables to be connected using the piercing technique.

According to the invention, this object is achieved by:

determining, at a plurality of points in a scanning region which is axially and/or azimuthally extended with respect to an axis of the twisted-pair cable, an inductive coupling between a first circuit arranged at each respective point and the twisted-pair cable as a second circuit, and determining a position of the cores of the twisted-pair cable on the basis of the values determined for the inductive coupling at the points.

The invention is based on the consideration that it is possible to determine the position of the wires in particular by means of the magnetic properties of the wire pairs of the twisted-pair cable. In this sense, the term inductive coupling as used in this application refers to any coupling of a magnetic field into an unconnected circuit in which properties of this circuit are changed by the magnetic field, in particular the induction of a current, the change of a voltage (as in the Hall effect) or the change of a resistance (as in other magnetoresistive effects). The twisting causes the strength of the inductive coupling to change depending on the location and direction along the twisted line. Due to the periodicity, minima and maxima are also formed in the corresponding period. Depending on the type of circuits used and their specific arrangement in relation to each other, maxima or minima will form when the sensor is parallel or perpendicular to the two adjacent conductors. This means that such a "twisted pair cable next to each other" position can be detected by finding a corresponding maximum or minimum of the inductive coupling on the points. Scanning can be carried out either axially, i.e. along the cable, or azimuthally, i.e. in the circumferential direction. However, the distance to the axis of the cable should remain constant, i.e. the area is defined on a cylindrical surface around the twisted pair cable.

Advantageously, the method is therefore used to determine a radial position relative to the twisted-pair cable, with respect to which the cores of the twisted-pair cable are arranged next to each other. This refers to a position from which the imaginary connecting line between the cores is perpendicular to the radial direction when viewed in the radial direction towards the axis of the twisted-pair cable, i.e. the cores lie next to each other. Such a position is then suitable for connecting the twisted pair cable using piercing technology by piercing the cable from the radial direction with two piercing mandrels arranged at the same distance as the two cores.

In a first advantageous embodiment of the method, the inductive coupling at the points is determined sequentially. This can be done, for example, by positioning the first circuit successively at each of the points. In such an embodiment, the second circuit is moved in relation to the twisted pair cable in an azimuthal or axial direction in order to find a minimum or maximum of the inductive coupling. The points can therefore be formed not only discretely, but also as a continuum, by traversing a predetermined length of the cable (which is advantageously at least one twisting period of the twisted-pair cable long).

Alternatively, several first circuits can be provided at discrete points in which the inductive coupling is determined one after the other. In this case, the points provided for measuring or determining the inductive coupling are then discrete. In both cases of sequential determination described above, mechanical aids such as a slide can be used to ensure a uniform radial distance between the respective circuit (s) and the twisted pair cable.

In a second advantageous embodiment the inductive coupling at the points is determined in parallel. This is done in particular by arranging a large number of first circuits at each of the points. The inductive coupling is then measured simultaneously in all first circuits.

Here, the inductive coupling is advantageously determined in that each first circuit is designed as a primary circuit and the second circuit is designed as a secondary circuit, or in that the second circuit is designed as a primary circuit and each first circuit is designed as a secondary circuit, whereby a current flow is caused in the primary circuit and a current and/or voltage change induced thereby in the respective secondary circuit is measured. In other words, a current flow can be generated in the twisted-pair cable, the magnetic field of which is then measured in the first circuit(s) brought in from outside, or a current flow can be generated in the first circuit, the magnetic effect of which on the twisted-pair cable is measured (e.g. by then measuring the current induced there).

In the latter case, a sequential determination would be necessary without additional measures, since there is only one measuring point (the twisted pair cable) and otherwise the effects of each individual first circuit could not be distinguished. However, this is made possible by the fact that, in the event that each first circuit is designed as a primary circuit and the second circuit as a secondary circuit, and that a plurality of first circuits is provided, the current flow caused in each primary circuit is advantageously an alternating current signal of different frequency and a comparison of the amplitudes of the frequency components in the secondary circuit takes place. By using different frequencies in each primary circuit, it is possible to identify each primary circuit in the superimposed signal in the secondary circuit. For this purpose, only the amplitudes of the respective frequency components in the superimposed signal in the secondary circuit need to be determined, which makes it possible to compare the strength of the magnetic coupling between each primary circuit and the secondary circuit.

The current flow in the primary circuit (which—as explained above—can be either the first circuit arranged outside or the twisted-pair cable itself) is advantageously generated by connection to a current source or by induction. If a power source is connected directly to the respective first circuit or the twisted pair cable as the second circuit, any signals are possible. For example, any AC signal can be fed in between the cores. Alternatively, a direct current signal can also be used. Alternatively, the current flow can also be caused by induction. In this case, however, an alternating current is required. For example, the twisted pair cable can be short-circuited at both ends (i.e. the ends of the wires on each side are connected to each other) and a coil is brought close to the cable, which then inductively generates the corresponding current flow in the cable. Induction can be achieved by current flow in the coil brought close to the cable or by moving this coil. Accordingly, a current flow can also take place by connecting the first circuit (s) to a current source if the inductive coupling is determined by measuring the induced current in the twisted pair cable.

If the first circuit (s) is/are designed as a secondary circuit, the respective secondary circuit is advantageously designed as a magnetic field sensor, in particular as a magnetoresistive sensor, a Hall sensor or a fluxgate magnetometer. With all the sensors mentioned it is possible to reliably determine the strength of the inductive coupling.

Alternatively, each first circuit is advantageously designed as a coil. This can be designed as an air-core coil or as a coil with a solid core. The core of the coil can advantageously have a shape that allows the inductive coupling to be determined more precisely, for example by directing the ends of the core in the direction of the twisted pair cable. It is therefore possible to design the coil for both measurement directions, i.e. either when the first circuit is designed as a primary circuit or when it is designed as a secondary circuit.

Advantageously, the first circuit (s) is/are arranged in such a way that the respective coil is aligned tangentially to the axis of the twisted-pair cable, i.e. the axis of the coil is not aligned parallel to the axis of the twisted-pair cable, but tangentially to an imaginary circle around the axis of the twisted-pair cable. Such an arrangement results in maximum inductive coupling, so that the maxima and minima in the detection range can be determined particularly easily.

In an advantageous embodiment of the method, the current flow caused in the primary circuit is formed as an asymmetrical alternating current signal. Since the signal shape is mapped in the generated magnetic field, it is also measured accordingly. If the AC signal is asymmetrical, especially if it is fed between the cores of the twisted pair cable as the primary circuit, not only can the position of the cores in relation to each other (next to each other or on top of each other) be determined, but even the individual cores can be identified.

A device for determining the position of the cores of a twisted-pair cable advantageously comprises a number of first circuits, at least one current source and a coil or a magnetic field sensor, and is adapted to carry out at least one embodiment of the methods described above.

Such a device advantageously comprises a display device on which the position of the wires in the area is displayed. This can advantageously be designed as a display which extends parallel to the twisted-pair cable and on which the position of the twisted-pair cable is displayed symbolically at the respective position of the display.

Furthermore, a described device preferably comprises first communication means associated with the current source and second communication means associated with the coil or the magnetic field sensor, which are designed for data transmission between the first and second communication means by modulating data signals on the twisted pair cable. Since a described device has two spatially separated components, namely those for controlling the current source for causing a current in the respective primary circuit and those for controlling the measurement of the magnetic coupling in the secondary circuit, data transmission via modulation on the twisted pair cable enables a more compact design of the device, since external cabling or a further, optionally also wireless, transmission path between the two components could be omitted. For example, a central control device could be provided on the secondary side, which automatically starts a measurement process and transmits for starting the causation of the currents in the respective primary circuits (e.g. "Primary circuit 2 on/off with frequency X") via modulation over the twisted pair cable to the component for controlling the current source.

A system advantageously comprises a device as described above, a device for piercing a twisted pair cable, and a carriage, wherein the carriage has locking means on the twisted pair cable. The carriage should therefore be able to move in an axial and/or azimuthal direction along and/or around the twisted-pair cable, while maintaining a constant radial distance from the cable. Locking means are provided which can lock the slide (after a suitable position has been determined by displacement) in the specified position relative to the twisted pair cable. For this purpose, they advantageously connect the slide firmly (but detachably) to the twisted pair cable. The carriage further advantageously comprises positioning means, wherein the positioning means are designed for arranging either the described device for determining the position of the wires or the device for piercing a twisted-pair cable in a predefined position within the positioning means. In other words, the said positioning means are intended to serve to alternatively position either the device for determining the position or the device for piercing on the carriage, the arrangement of the two devices relative to one another remaining spatially stable. This can be ensured, for example, by an identical external shape of the two devices with a corresponding negative shape in the carriage, or by suitable pins on the carriage that engage in drilled holes in the devices (or vice versa). The aim is to ensure that the cables are pierced at the correct position once the appropriate radial position and displacement of the carriage have been determined. For this purpose, the display device advantageously has a target position indicator for determining a radial position relative to the twisted-pair cable, with respect to which the cores of the twisted-pair cable are arranged next to each other.

The advantages achieved with the invention consist in particular in the fact that by determining the position of the cores of a twisted pair cable by means of inductive coupling, it is possible to connect the cores without manually stripping and separating the cores. The localization of the position "twisted pair cable next to each other" (instead of "on top of each other") enables the contacting of a twisted pair cable using piercing technology. This makes it technically easier to use such twisted cables, which are required for single-pair Ethernet (SPE), among other things. Particular advantages of the magnetic field principle include the fact that electrical ambient field components hardly interfere and the method can also be used for electrically shielded twisted pair cables.

Figures 5, 6, 7, 8:
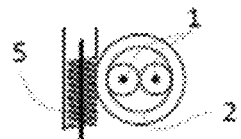
Figure 9:
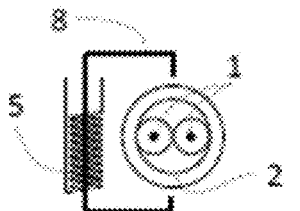
Figure 10:
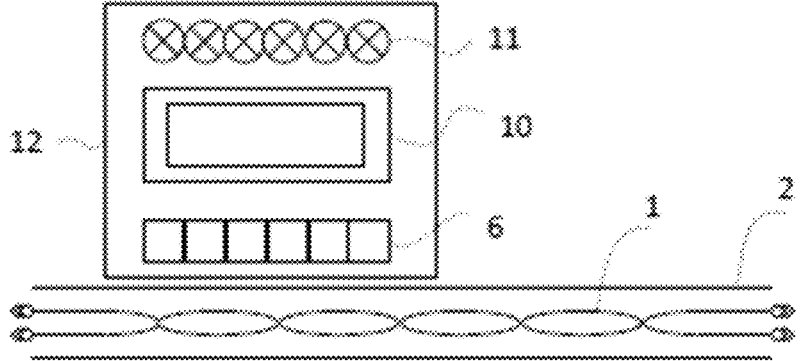
Figure 11:
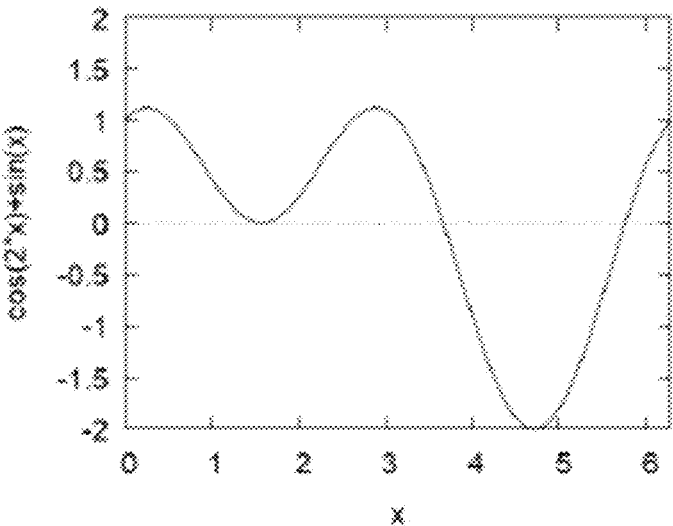
Figure 12:
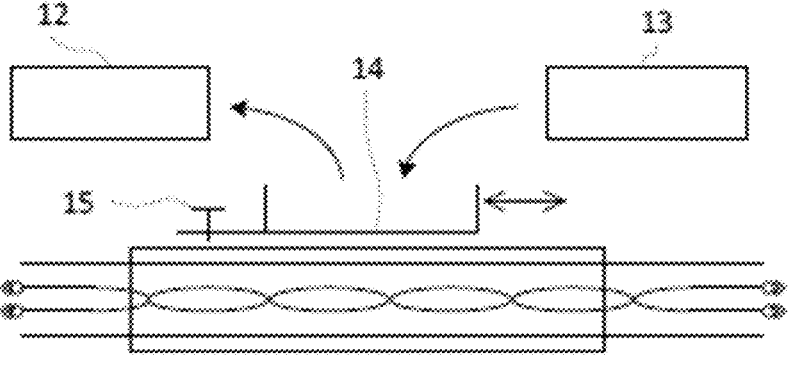

Examples of embodiments of the invention are explained in more detail below with reference to drawings, wherein FIG. 1 shows a device for determining the position of the cores of a twisted pair cable, whereby the twisted pair cable serves as the primary circuit and the scanning range is extended in the axial direction, FIG. 2 shows the device according to FIG. 1, whereby the scanning range is extended in azimuthal direction, FIG. 3 shows a corresponding device with a plurality of first circuits as secondary circuits, which extend in the axial direction, FIG. 4 shows a device similar to FIG. 3, whereby the first circuits are not designed as coils but as other magnetic field detectors, FIG. 5 shows a device similar to FIG. 1, with the twisted pair cable serving as a secondary circuit, FIG. 6 shows a device similar to FIG. 5 with several first circuits as primary circuit, FIG. 7 shows a device similar to FIG. 4, whereby a current is inductively caused in the twisted pair cable as the primary circuit, FIG. 8 shows a cross-section of a twisted-pair cable showing one layer of an outer coil with maximum inductive coupling, FIG. 9 shows a cross-section through a twisted-pair cable showing a layer of an alternative outer coil with a bent core with maximum inductive coupling, FIG. 10 shows a device similar to FIG. 4 or FIG. 7 with integrated display and light elements to indicate a position suitable for the application of the piercing technique, FIG. 11 shows a graph of an asymmetrical alternating current signal, and FIG. 12 shows a carriage with a device for piercing a twisted-pair cable and a device for determining the position of the cores of a twisted-pair cable.

Identical parts are marked with the same reference signs in all figures.

All drawings illustrate examples of the methods and devices described above for determining the position of the cores of a twisted pair cable. The aim here is to determine a position and direction from whose perspective the cores of the cable lie next to each other and can therefore be contacted using piercing technology. Common to the embodiments is that one or more external first circuits are placed in an axially and/or azimuthally extended area around the cable, and the inductive coupling of this or these circuit (s) with the twisted-pair cable as the second circuit is determined in the area. Depending on the arrangement and type of the first circuit, such a point can be found in the area at a maximum or minimum of the inductive coupling (due to symmetry considerations).

In a first group of advantageous embodiments, a magnetic field is induced by the twisted pair cable (conductor pair) (1) (FIG. 1, FIG. 3 and FIG. 4). In this case, the twisted pair cable (1) is therefore the primary circuit. In the embodiment examples, the twisted-pair cable (1) is surrounded by an electrical shield (2), but the method is just as applicable in other embodiment examples if no shield (2) is present. The twisted pair cable (1) is short-circuited at one point. A low impedance alternating current generator (3) is connected to a second point. For impedance transformation according to the transformer principle, a transformer can advantageously be connected between the twisted pair cable (1) and the AC generator. In other embodiments not shown, a direct current can also be generated in one of the two cores.

The current flowing in the twisted-pair cable (1) generates a magnetic field between the short-circuit point and the generator feed-in point, which has a location- and direction-dependent strength along the twisted cable. This local magnetic field is measured with a magnetic field sensor (6). In the examples in FIGS. 1-3, this is designed as a coil with an iron core and a connected voltage measuring device (4). In FIG. 1, the magnetic field sensor (6) can be positioned axially along the cable, i.e. the scanning range extends axially.

In an alternative advantageous embodiment according to FIG. 2, the magnetic field detected by the magnetic field sensor (6) is optionally changed by rotating the cable that comprises the twisted-pair cable (1). The scanning range is therefore azimuthally extended here. In both cases, however, the range is scanned sequentially.

In a further advantageous embodiment, several magnetic field sensors (6) are arranged next to each other and measure the local magnetic field strength in parallel (FIG. 3 and FIG. 4). In addition to the coils with a para- or ferromagnetic core already mentioned and shown in FIGS. 1-3, air coils, Hall sensors or generally magnetoresistive sensors or fluxgate magnetometers can also be used as magnetic field sensors. This is shown symbolically in FIGS. 4, 7 and 10.

Due to the inductive and capacitive coating of the twisted pair cable (1), the magnetic coupling is frequency-dependent and typically particularly high between 1 kHz and 1 MHz. It is therefore advantageous to use alternating currents with frequencies between 1 kHz and 1 MHz when using alternating current in the methods described.

Antennas are reversible in their effect and so, in a second group of advantageous embodiments, an external magnetic field is generated and the twisted pair cable (1) serves as a secondary circuit as a detector for the inductive coupling (FIG. 5 and FIG. 6). The outer coil (5) that generates the magnetic field can be moved along the cable (FIG. 5). The loop current in the twisted-pair cable (1) is measured with low impedance using a voltmeter (4) connected to the twisted-pair cable (1). If a high-impedance voltmeter (4) is used for this purpose, the resistance transformation is performed by a transformer. In another advantageous embodiment, several coils (5) are arranged next to each other and connected to the alternator (3) via a changeover switch (9) (FIG. 6). In any case, however, sequential measurement takes place at the various points in the scanning range.

If a coil (5) is used as the first circuit fed into the scanning area from the outside, its axis is advantageously oriented radially to the line with the twisted pair cable (1) (FIG. 1, FIG. 3, FIG. 5, FIG. 6 and FIG. 7). In a further advantageous embodiment, the coil axis is oriented tangentially to the cable (FIG. 8). The coil core is optionally designed as a toroidal core (8) with an air gap, in which the twisted pair cable (1) is located (FIG. 9).

In another advantageous embodiment, the current is also coupled into the twisted pair cable (1) as a primary circuit magnetically or inductively (FIG. 7). The twisted pair cable (1) is short-circuited on both sides for this purpose. The magnetic field is coupled in and out between these points. The coupling and decoupling elements are movable (FIG. 1) or rotatable (FIG. 2) or multiple (FIG. 3 and FIG. 4). This allows the coupling of the signal into the twisted pair cable (1) to be optimized. Magnetic shielding of the magnetic field sensors (6) in the axial direction from the coil (5) generating the magnetic field, for example by means of a shield (7) made of Mu metal, is advantageous.

To differentiate between the individual wires of the twisted pair cable (1), an unbalanced alternating current signal is optionally used in embodiments (FIG. 11). The orientation of the magnetic field generated in this way and therefore the polarity of the loop current and thus the assignment of the individual wires can be clearly determined from this. The asymmetrical alternating current signal advantageously has no DC voltage component and is described in FIG. 11 as an example by the signal form sin (x)+cos (2×).

The measured location-dependent magnetic coupling strength between the twisted-pair cable (1) and the external magnetic field probes or coils (6) is further visualized optionally by a display (10) and/or light elements (11), for example LEDs etc., which are mounted in a housing (12) (FIG. 10). The orientation of the twisted pair cable (1) within the line can be deduced from the location-dependent coupling strength. The cable sheath can now be provided with corresponding markings, for example by printing, whereby the printing indicates suitable piercing points.

The determined orientation of the twisted pair cable (1) can also be used directly to determine the favorable positions for contacting using piercing technology (FIG. 12). For this purpose, the entire system comprises a movable carriage (14), which is placed on the twisted pair cable and ensures a constant radial distance. The carriage (14) comprises positioning means in the form of a shell, into which the device (12) described above is inserted and a favorable contacting position is determined. Once the position has been found by moving the slide (14), it is locked onto the twisted pair cable (1) with locking means (15). The device (12) is now removed and replaced by a contacting device (13) that uses the exact contacting position previously determined and locked.

The twisted pair cable (1) is advantageously optionally part of a flat cable. With these cables, the twisting position is only dependent on the position along the cable, provided that the individual wires are mechanically connected to the flat cable with virtually no twisting.

The magnetic coupling between the twisted pair cable (1) and the external probe is also optionally used for contactless data transmission. The induced alternating current can have all known forms of modulation, such as amplitude, frequency, phase modulation, etc. and consist of one or more carrier frequencies. This enables a compact design of the device, as the components of the system assigned to the primary circuit, which are used to cause the current in the primary circuit, can communicate with the components of the system assigned to the secondary circuit by means of the modulation.

LIST OF REFERENCE SIGNS

1 Twisted pair cable
2 Shield
3 AC generator
4 Voltage measuring device
5 Coil
6 Magnetic field sensor
7 Shield
8 Toroidal core
9 Changeover switch
10 Display
11 Lighting element

12 Housing
13 Contacting device
14 Carriage
15 Locking means

What is claimed is:

1. A method for piercing a twisted-pair cable, comprising:
determining, at a plurality of points in a scanning region which is axially and/or azimuthally extended with respect to an axis of the twisted-pair cable, an inductive coupling between a first circuit arranged at each respective point and the twisted-pair cable as a second circuit,
determining a position of cores of the twisted-pair cable on a basis of values determined for the inductive coupling at the plurality of points,
determining a radial position relative to the twisted-pair cable, with respect to which the cores of the twisted-pair cable are arranged next to one another, and
arranging a device for piercing the twisted-pair cable in said position.

2. The method according to claim 1, wherein the determination of the inductive coupling at the plurality of points is carried out sequentially.

3. The method according to claim 1, wherein the inductive coupling at the plurality of points is determined in parallel.

4. The method according to claim 1, wherein the inductive coupling is determined by each first circuit being designed as a primary circuit and the second circuit being designed as a secondary circuit, or by the second circuit being designed as a primary circuit and each first circuit being designed as a secondary circuit, a current flow being caused in the primary circuit, and a current and/or voltage change induced thereby in the respective secondary circuit being measured.

5. The method according to claim 4, wherein each first circuit is designed as a primary circuit and the second circuit is designed as a secondary circuit, wherein a plurality of first circuits is provided and wherein the current flow caused in each primary circuit is an alternating current signal of different frequency and a comparison of amplitudes of frequency components takes place in the secondary circuit.

6. The method according to claim 4, wherein the current flow in the primary circuit is generated by connection to a current source or by induction.

7. The method according to claim 4, wherein the respective secondary circuit is designed as a magnetic field sensor.

8. The method according to claim 4, wherein the current flow caused in the primary circuit is in a form of an asymmetrical alternating current signal.

9. The method according to claim 1, wherein each first circuit is designed as a coil.

10. The method according to claim 9, wherein the respective coil is aligned tangentially to the axis of the twisted-pair cable.

11. A device for determining the position of the cores of a twisted-pair cable, comprising a number of first circuits, at least one current source and a coil or a magnetic field sensor, adapted for carrying out the method according to claim 1.

12. The device according to claim 11, comprising a display device on which a position of the cores in an area is displayed.

13. The device according to claim 11, comprising first communication means associated with the current source and second communication means associated with the coil or the magnetic field sensor, which are designed for data transmission between the first and second communication means by modulation of data signals on the twisted-pair cable.

14. A system comprising a device according to claim 12, a device for piercing a twisted pair cable, and a carriage, the carriage having locking means on the twisted pair cable and positioning means, wherein the positioning means are adapted for arranging either the device according to claim 13 or the device for piercing a twisted-pair cable in a predefined position within the positioning means, and the display device comprises a target position indicator for determining a radial position relative to the twisted-pair cable with respect to which the cores of the twisted-pair cable are arranged side by side.

\* \* \* \* \*